US 6,509,240 B2

(12) United States Patent
Ren et al.

(10) Patent No.: US 6,509,240 B2
(45) Date of Patent: Jan. 21, 2003

(54) ANGLE IMPLANT PROCESS FOR CELLULAR DEEP TRENCH SIDEWALL DOPING

(75) Inventors: Liping Ren, Los Angeles, CA (US); Srikant Sridevan, Redondo Beach, CA (US)

(73) Assignee: International Rectifier Corporation, El Segundo, CA (US)

( * ) Notice: Subject to any disclaimer, the term of this patent is extended or adjusted under 35 U.S.C. 154(b) by 0 days.

(21) Appl. No.: 09/852,579

(22) Filed: May 10, 2001

(65) Prior Publication Data

US 2001/0041400 A1 Nov. 15, 2001

Related U.S. Application Data

(60) Provisional application No. 60/204,033, filed on May 15, 2000.

(51) Int. Cl.[7] ............................................. H01L 21/336
(52) U.S. Cl. ...................................... 438/302; 438/700
(58) Field of Search ................................ 438/222, 226, 438/246, 245, 247, 388, 302, 389, 390, 524, 559, 700

(56) References Cited

U.S. PATENT DOCUMENTS

| | | | | |
|---|---|---|---|---|
| 5,047,359 A | * | 9/1991 | Nagatomo | 438/524 |
| 5,057,444 A | * | 10/1991 | Fuse et al. | 438/524 |
| 6,040,600 A | | 3/2000 | Uenishi et al. | 257/330 |
| 6,103,578 A | | 8/2000 | Uenishi et al. | 438/268 |
| 6,274,437 B1 | * | 8/2001 | Evans | 438/272 |

* cited by examiner

*Primary Examiner*—David Nelms
*Assistant Examiner*—David Nhu
(74) *Attorney, Agent, or Firm*—Ostrolenk, Faber, Gerb & Soffen, LLP

(57) ABSTRACT

A process is described for making a superjunction semiconductor device, a large number of symmetrically spaced trenches penetrate the N$^-$ epitaxial layer of silicon atop an N$^+$ body to a depth of 35 to 40 microns. The wells have a circular cross-section and a diameter of about 9 microns. The trench walls are implanted by an ion implant beam of boron which is at a slight angle to the axis of the trenches. The wafer is intermittently or continuously rotated about an axis less than 90° to its surface to cause skewing of the implant beam and more uniform distribution of boron ions over the interior surfaces of the trenches.

10 Claims, 2 Drawing Sheets

ANGLE IMPLANT PROCESS FOR CELLULAR DEEP TRENCH SIDEWALL DOPING

RELATED APPLICATIONS

This application is related to and claims priority to Provisional Application Ser. Nos. 60/204,033, filed May 15, 2000.

FIELD OF THE INVENTION

This invention relates to superjunction semiconductor devices and more specifically relates to a novel process for forming a uniform implant and diffusion into the side walls of spaced cell elements of a superjunction device.

BACKGROUND OF THE INVENTION

Superjunction devices are well known and are described, for example, in U.S. Pat. Nos. 4,754,310 to Coe; 5,216,275 to Chen; and 3,925,803 to Sony.

Although the so called superjunction has brought a new concept to power MOSFET devices, the present processes to realize the design concept are difficult and complex. In one known process, a relatively shallow $N^-$ epitaxial layer is formed atop an $N^+$ substrate, and spaced P diffusions which form portions of P columns are diffused in the layer. A series of such N layers are grown atop one another, with corresponding P diffusions stacked atop one another until the desired P column height is reached. A typical process could be realized by using multi-implants and epitaxial growths as shown in FIG. 1.

Such a fabrication process is not only complex and expensive, but also degrades the electrical characteristics because of the non-uniform doping profile formed by multi-implants and epitaxial growths. Other processes have been proposed in which trenches are etched in an N body and then filled in with a further layer of P material. A process of this type is shown in copending application Ser. No. 09/732,401, filed Dec. 7, 1900 entitled HIGH VOLTAGE VERTICAL CONDUCTION SUPERJUNCTION SEMICONDUCTOR DEVICE in the names of Daniel M. Kinzer and Srikant Sridevan (IR-1756). These processes are bulky and complex, particularly when spaced cells or pylons of one concentration type is to be formed in a body of a different conductivity type.

Still another process is known in which parallel trenches are formed in an $N^-$ epitaxial layer and in which the walls of the trenches are simply diffused with a P type dopant of sufficient concentration and depth to be in charge balance with the surrounding $N^+$ epitaxial body. In such devices, it is difficult to obtain uniform P type concentration along the length of the walls of the trench, particularly for a deep trench.

BRIEF SUMMARY OF THE INVENTION

In this invention, an angle implant is provided for directly doping the sidewalls of deep cells in a uniform and well controlled manner. The basic concept of the invention is that after the deep trench etching, an angle implant is used to dope the trench sidewall. The implant angle can be easily adjusted by the implant machine to assure that doping ions reach the bottom of the trench. The selected angle value depends on the depth and width of the trench. By further rotating the implant sample wafers, either intermittently or continuously, the trench sidewalls are uniformly doped along their full length. The cross-section of the trenches can have different forms, such as hexagon, stripe, circle, or rectangle and the like. The doping distribution, junction depth and surface concentration of the trenches are determined by implant energy, dose, species and as annealing conditions. The main advantages of the invention are as follows: (1) there is only a single implant and no epitaxial growth is needed for a trench; (2) the trenched sidewall can be easily and uniformly doped in one operation; (3), the cost, in comparison with the conventional trench formation, is greatly reduced; (4) ultra shallow junctions can be formed and controlled, which is essential for reducing transistor cell size; (5) the generated uniform doping profile formed by direction implantation is critical for establishment of an ideal regular rectangle shape for the characteristic curve of electrical field along the trench depth, which is a basic requirement for a superjunction device.

DETAILED DESCRIPTION OF THE DRAWINGS

Figure 1:
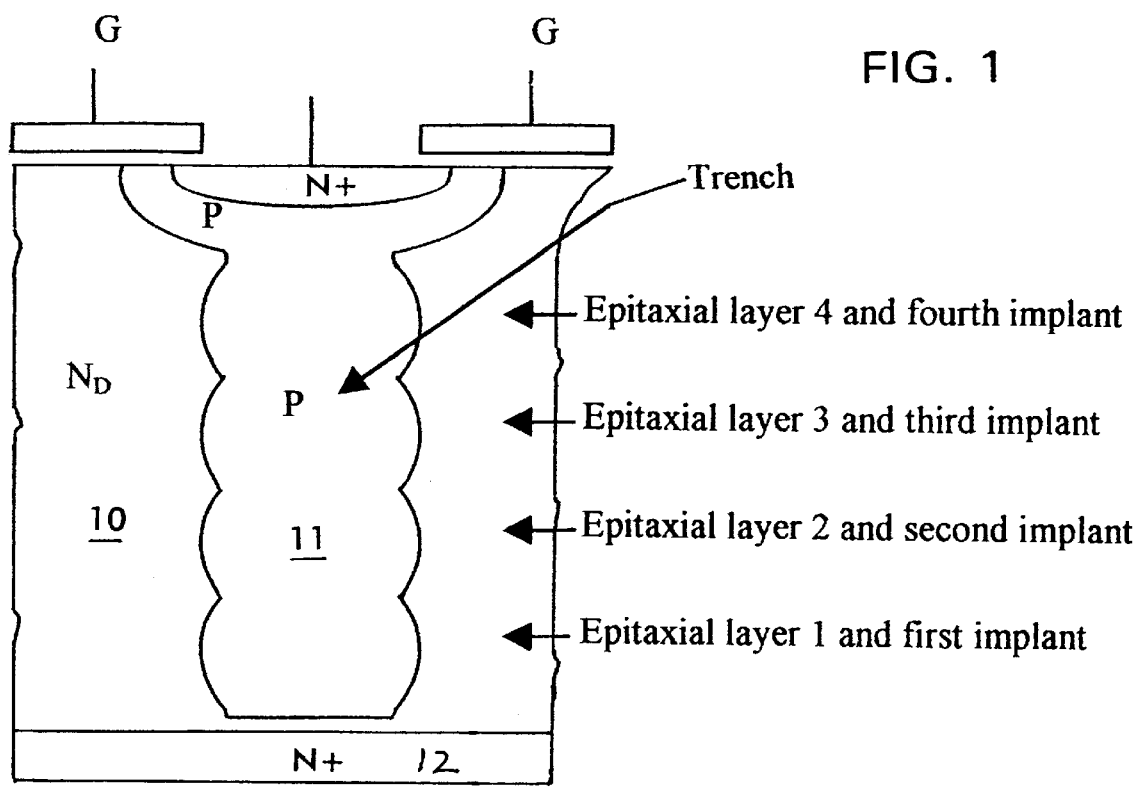
FIG. 1 is a cross-section showing one cell of a typical prior art superjunction device.

FIG. 1 shows in a cross-section a superjunction structure in a silicon die in which an $N^-$ body 10 of silicon is epitaxially grown atop an $N^+$ substrate 12. Deep spaced $P^+$ pylons or columns 11 are formed into body 10, with the $N^-$ and $P^+$ regions being sized and having concentrations such that both deplete fully under reverse bias.

The process used to make the device requires the sequential growth of layers of $N^-$ silicon and the P type diffusion into each layer to form a pylon of sufficient length, for example, 35 microns. This is a complex and costly process.

Figure 3:
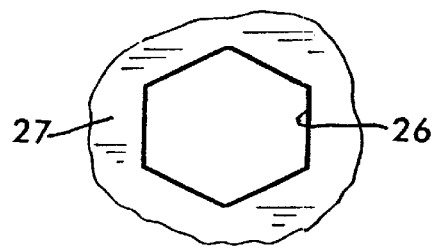
FIG. 3 is a top view of the cell of FIG. 2.
Figure 4:
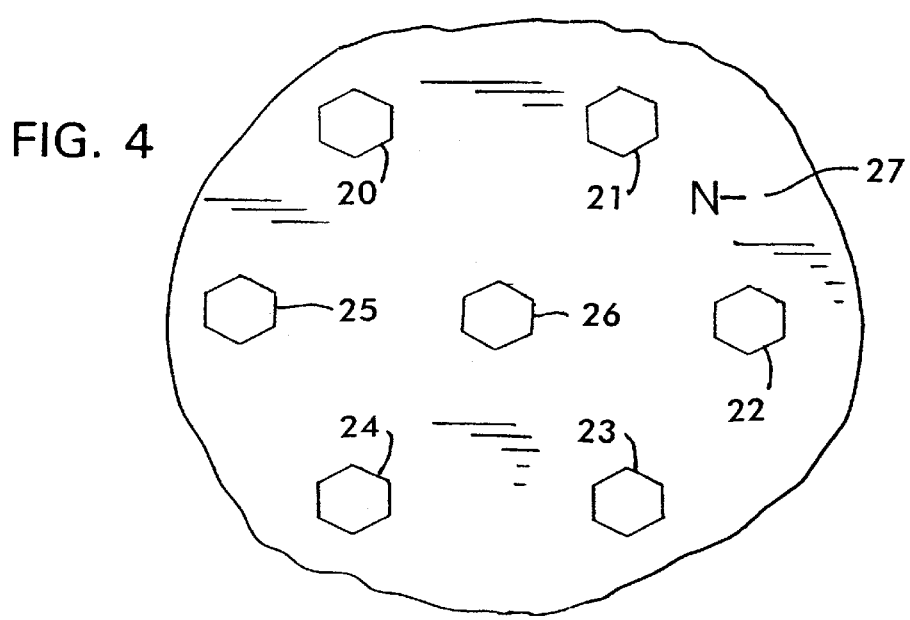
FIG. 4 is a top view of a portion of a wafer containing cells such as those of FIGS. 2 and 3.
Figure 5:
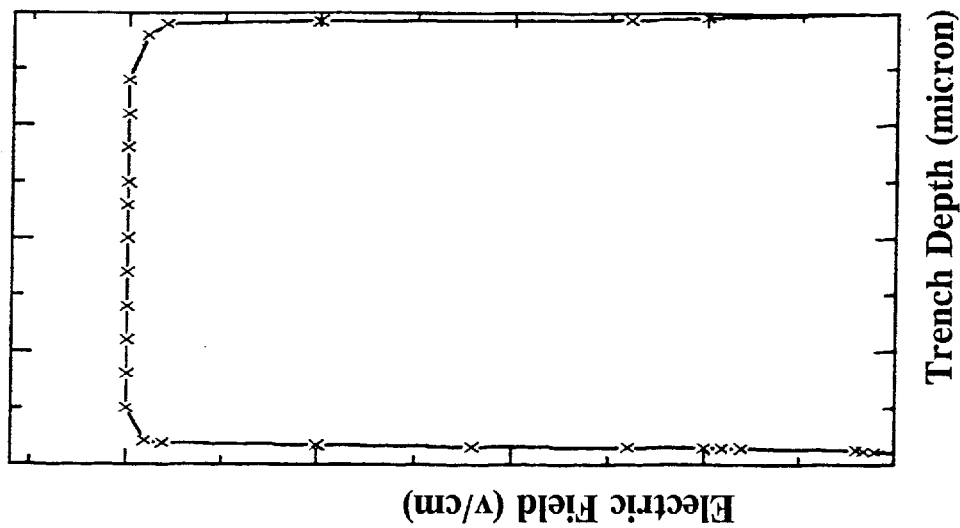
FIG. 5 is a plot of electric field versus trench depth for the structure of FIG. 2.
Figure 2:
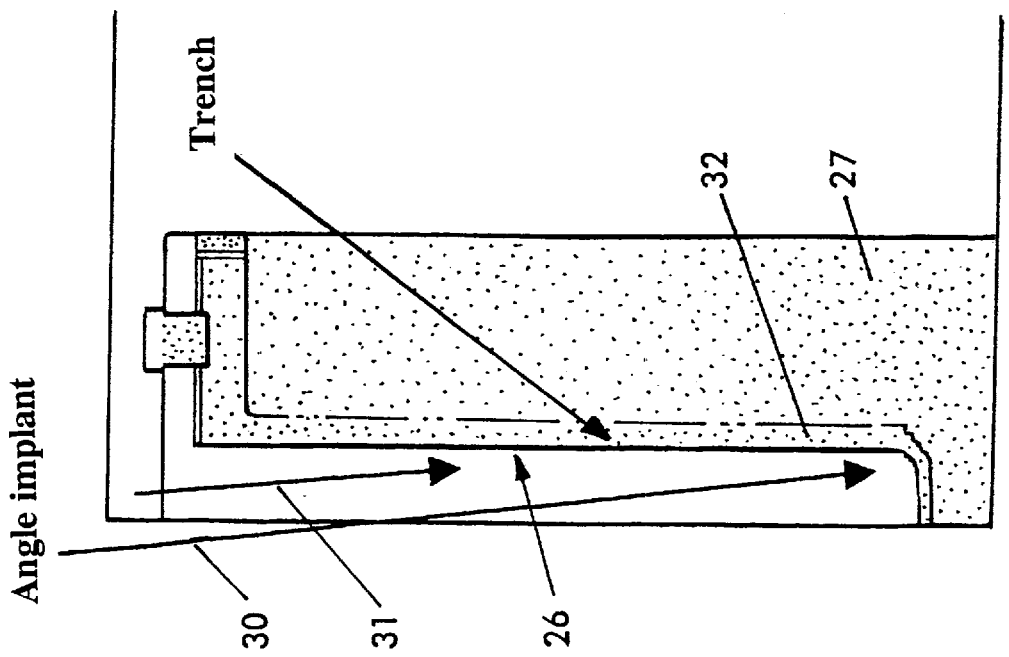
FIG. 2 is a cross-section of one half of a cell of a superjunction device which is implanted and rotated in accordance with the invention.

In accordance with the invention, and as shown in FIGS. 2, 3 and 4, a plurality of spaced trenches, for example, trenches 20 to 26 are etched into an $N^-$ body 27 to a depth, for example, of greater than 25 microns, and more preferably of 30 to 50 microns and a width, for example, of less than 9 microns, and more preferably, of 2 to 5 microns. Thereafter, an implant is carried out at a shallow angle, for example, 1 to 20°, and more preferably 2 to 7° from the central vertical axis of trenches 20 to 26, shown schematically by arrows 30 and 31 in FIG. 2. Significantly, during the implant, the wafer 27 will be rotated continuously or in steps about an axis perpendicular to its surface and in skew, so that the implant beam will be fully equally distributed over all surfaces of the trenches. For example, a plurality of separate implants can be made, each along the depth of the trench and on an interior surface defined by a small angle in a plane perpendicular to the trench axis. The wafer is then rotated or stepped to new angular positions and a further implant is carried out at each new angle. These sequential implants may be done in 4 steps of 90° C. each or 6 steps of 60° C. each, or the like.

The implant species is a P type material, for example, boron. In one example, the boron implant is carried out at 30 KeV and a dose of 3E13 to 1E14 atoms/cm², followed by an anneal at 1050° C. for 40 to 90 minutes. The trenches are spaced by 4.5 to 9 microns and are formed in N⁻ epitaxially grown silicon having a resistivity of 3 to 3.5 ohm cm. The implant will produce a P type surface region 32 for the cells 20 to 26 which, when activated will have a depth and concentration matched to that of the surrounding N⁻ body 27 so that the two will both deplete during reverse bias of the junction 32/27.

FIG. 4 shows the desirable distribution of electric field versus trench depth which is obtained.

The final device may be completed as usual by the addition of a MoSgated control structure, and source and drain electrodes as disclosed in application Ser. No. 09/732, 401.

Although the present invention has been described in relation to particular embodiments thereof, many other variations and modifications and other uses will become apparent to those skilled in the art. It is preferred, therefore, that the present invention be limited not by the specific disclosure herein

What is claimed is:

1. A process of manufacture of a superjunction device comprising the steps of forming spaced parallel trenches into a silicon wafer of one conductivity type; each of said trenches having an axis along a depth dimension with said axes being perpendicular to a top surface of said silicon wafer; each of said trenches having approximately a same depth and cross section; directing an implant beam of a species which defines a second conductivity type toward said top surface of said silicon wafer and at an angle to said axes of each of said trenches; said angle being sufficiently small that a full length of an interior surface of each of said trenches receives implanted ions from said implant beam; rotating said wafer to expose a full surface area of an interior of each of said trenches to said implant beam; and maintaining said implant beam directing and said wafer rotating until a sufficient depth and concentration of said second conductivity type is achieved to match that of said silicon wafer when activated, such that regions near said trenches of opposite conductivity type both deplete during reverse bias.

2. The process of claim 1, wherein said trenches are symmetrically disposed over said top surface of said wafer.

3. The process of claim 1, wherein said ion implant angle is between 1 degrees and 20 degrees.

4. The device of claim 1, wherein said one conductivity type is N type.

5. The process of claim 2, wherein said ion implant angle is between 1 degrees and 20 degrees.

6. The device of claim 1, wherein said trenches have a depth of greater than about 25 microns and a width which is less than about 9 microns.

7. The device of claim 2, wherein said trenches have a depth of greater than about 25 microns and a width which is less than about 9 microns.

8. The device of claim 3, wherein said trenches have a depth of greater than about 25 microns and a width which is less than about 9 microns.

9. The device of claim 5, wherein said trenches have a depth of greater than about 25 microns and a width which is less than about 9 microns.

10. A process of manufacture of a superjunction device comprising the steps of forming spaced parallel trenches into a silicon wafer of one conductivity type; each of said trenches having an axis along a depth dimension with said axes being perpendicular to a top surface of said silicon wafer; each of said trenches having a depth of greater than about 25 microns and a width of less than about 9 microns; directing an implant beam of a species which defines a second conductivity type toward said top surface of said silicon wafer and at an angle to said axes of each of said trenches; said angle being sufficiently small that a full length of an interior surface of each of said trenches receives implanted ions from said implant beam; and rotating said wafer to expose a full surface area of an interior or each of said trenches to said implant beam.

* * * * *